(12) United States Patent
Han et al.

(10) Patent No.: US 11,088,304 B2
(45) Date of Patent: Aug. 10, 2021

(54) DISPLAY DEVICE AND METHOD FOR MANUFACTURING THE SAME

(71) Applicant: SAMSUNG ELECTRONICS CO., LTD., Suwon-si (KR)

(72) Inventors: Seung Ryong Han, Suwon-si (KR); Hyun Sun Kim, Suwon-si (KR); Sang Moo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 16/561,901

(22) Filed: Sep. 5, 2019

(65) Prior Publication Data

US 2020/0075820 A1 Mar. 5, 2020

(30) Foreign Application Priority Data

Sep. 5, 2018 (KR) .................. 10-2018-0106126
Aug. 28, 2019 (KR) .................. 10-2019-0106121

(51) Int. Cl.
*H01L 33/56* (2010.01)
*H01L 33/62* (2010.01)
*H01L 25/075* (2006.01)

(52) U.S. Cl.
CPC .......... *H01L 33/56* (2013.01); *H01L 25/0753* (2013.01); *H01L 33/62* (2013.01); *H01L 2933/005* (2013.01)

(58) Field of Classification Search
CPC combination set(s) only.
See application file for complete search history.

(56) References Cited

U.S. PATENT DOCUMENTS

| | | | |
|---|---|---|---|
| 10,418,331 B2* | 9/2019 | Bower | H01L 24/19 |
| 2002/0163301 A1 | 11/2002 | Morley et al. | |
| 2005/0020175 A1 | 1/2005 | Tamashiro et al. | |
| 2015/0221712 A1 | 8/2015 | Yu et al. | |
| 2016/0351539 A1* | 12/2016 | Bower | H01L 25/0655 |
| 2017/0148771 A1 | 5/2017 | Cha et al. | |
| 2017/0309698 A1* | 10/2017 | Bower | H01L 27/3276 |
| 2020/0235075 A1* | 7/2020 | Tsai | H01L 33/483 |

OTHER PUBLICATIONS

International Search Report (PCT/ISA/210) dated Jan. 3, 2020 issued by the International Searching Authority in International Application No. PCT/KR2019/011490.

* cited by examiner

*Primary Examiner* — Mamadou L Diallo
(74) *Attorney, Agent, or Firm* — Sughrue Mion, PLLC

(57) ABSTRACT

Provided is a display device including a plurality of display modules each including a plurality of inorganic light emitting elements mounted on a mounting surface of a substrate, a light absorbing pattern formed between the plurality of display modules and an encapsulation layer formed on mounting surfaces of the plurality of display modules to cover the mounting surfaces of the plurality of display modules.

20 Claims, 16 Drawing Sheets

US 11,088,304 B2

DISPLAY DEVICE AND METHOD FOR MANUFACTURING THE SAME

CROSS-REFERENCE TO RELATED APPLICATION

This application is based on and claims priority under 35 U.S.C. § 119 to Korean Patent Application Nos. 10-2018-0106126 filed on Sep. 5, 2018, and 10-2019-0106121 filed on Aug. 28, 2019, the disclosures of which are incorporated herein by reference in its entirety.

BACKGROUND

1. Field

The disclosure relates to a display device using a combination of modules with self-light emitting inorganic light emitting elements mounted on a substrate to display an image.

2. Discussion of Related Art

A display device is a kind of output device for visually presenting data information such as characters, figures, etc., and still or video images.

For conventional display devices, a liquid crystal panel or organic light emitting diode (OLED) panel formed by depositing OLEDs on a substrate is usually used. However, the liquid crystal panel has slow response time and high power consumption, and is difficult to be compact because it cannot emit light on its own and requires backlight. The OLED panel also has a problem with a short lifespan and bad productivity rate. Hence, as a new panel to replace them, a micro LED panel having inorganic light emitting elements mounted on a substrate and using the inorganic light emitting elements themselves as pixels is being studied.

The micro LED panel can be designed to be compact and slim because it may not need backlight and may have a minimized bezel portion, and has good properties in brightness, resolution, power consumption, and durability.

Furthermore, as complex processes are not required except for a process to pick up and transfer the inorganic light emitting element onto the substrate from a wafer, the micro LED panel may be manufactured to have various resolutions and sizes, and may implement a large screen by putting unit panels together. However, in putting the unit panels together, a gap is created at joints between the panels, which may degrade image quality.

SUMMARY

The disclosure provides a display device and method for manufacturing the same, by which image degradation that may otherwise occur due to seams between a plurality of display modules in putting the display panels together to implement a large screen is minimized.

In accordance with an aspect of the disclosure, provided is a display device including a plurality of display modules each including a substrate and a plurality of inorganic light emitting elements mounted on a mounting surface of the substrate, a light absorbing pattern formed to cover a gap between the plurality of display modules, and an encapsulation layer formed on mounting surfaces of the plurality of display modules to cover the mounting surfaces of the plurality of display modules.

The light absorbing pattern may include a cross-striped form.

The substrate may include an anisotropic conductive layer for electrically connecting contact electrodes of the plurality of inorganic light emitting elements to pad electrodes of the substrate.

The light absorbing pattern may be formed on the anisotropic conductive layer.

The encapsulation layer may be formed to cover the light absorbing pattern.

The substrate may include a glass substrate and a thin film transistor (TFT) layer formed on the glass substrate.

The encapsulation layer may include a transparent molding resin made with at least one of acrylic resin, polyimide resin, epoxy resin, polyurethane resin, or silicon resin.

The encapsulation layer may include an optical adhesive made with one of an optical cleared adhesive (OCA) and an optical clear resin (OCR).

The display device may further include a cover glass attached onto the optical adhesive.

The display device may further include an auxiliary light absorbing pattern formed between the plurality of inorganic light emitting elements.

The display device may further include a rear cover for supporting the plurality of display modules.

The substrate may include a light absorbing layer formed entirely on the mounting surface to enhance contrast by absorbing external light.

In accordance with another aspect of the disclosure, provided is a method for manufacturing a display device, the method including preparing a plurality of display modules each formed with a plurality of inorganic light emitting elements mounted on a mounting surface of a substrate, arranging the plurality of display modules to be adjacent to each other, forming a light absorbing pattern to cover a gap formed between the plurality of display modules, and forming an encapsulation layer on mounting surfaces of the plurality of display modules to cover the mounting surfaces of the plurality of display modules.

The plurality of inorganic light emitting elements mounted on the mounting surface of a substrate may be obtained by picking up the plurality of inorganic light emitting elements from a wafer and transferring the plurality of inorganic light emitting elements onto the substrate.

The arranging of the plurality of display modules to be adjacent to each other may include arranging the plurality of display modules in the form of an M×N matrix.

The method may further include forming an auxiliary light absorbing pattern between the plurality of inorganic light emitting elements.

The forming of the light absorbing pattern between the plurality of display modules and the forming of the auxiliary light absorbing pattern between the plurality of light emitting elements may be performed at the same time.

The forming of an encapsulation layer may include applying a transparent molding resin made with at least one of acrylic resin, polyimide resin, epoxy resin, polyurethane resin, or silicon resin onto the mounting surfaces of the plurality of display modules.

The forming of an encapsulation layer may include adhering an optical adhesive made with one of an optical cleared adhesive (OCA) and an optical clear resin (OCR) onto the mounting surfaces of the plurality of display modules.

The method may further include attaching a cover glass onto the optical adhesive.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION OF EXAMPLE EMBODIMENTS

Figure 1:
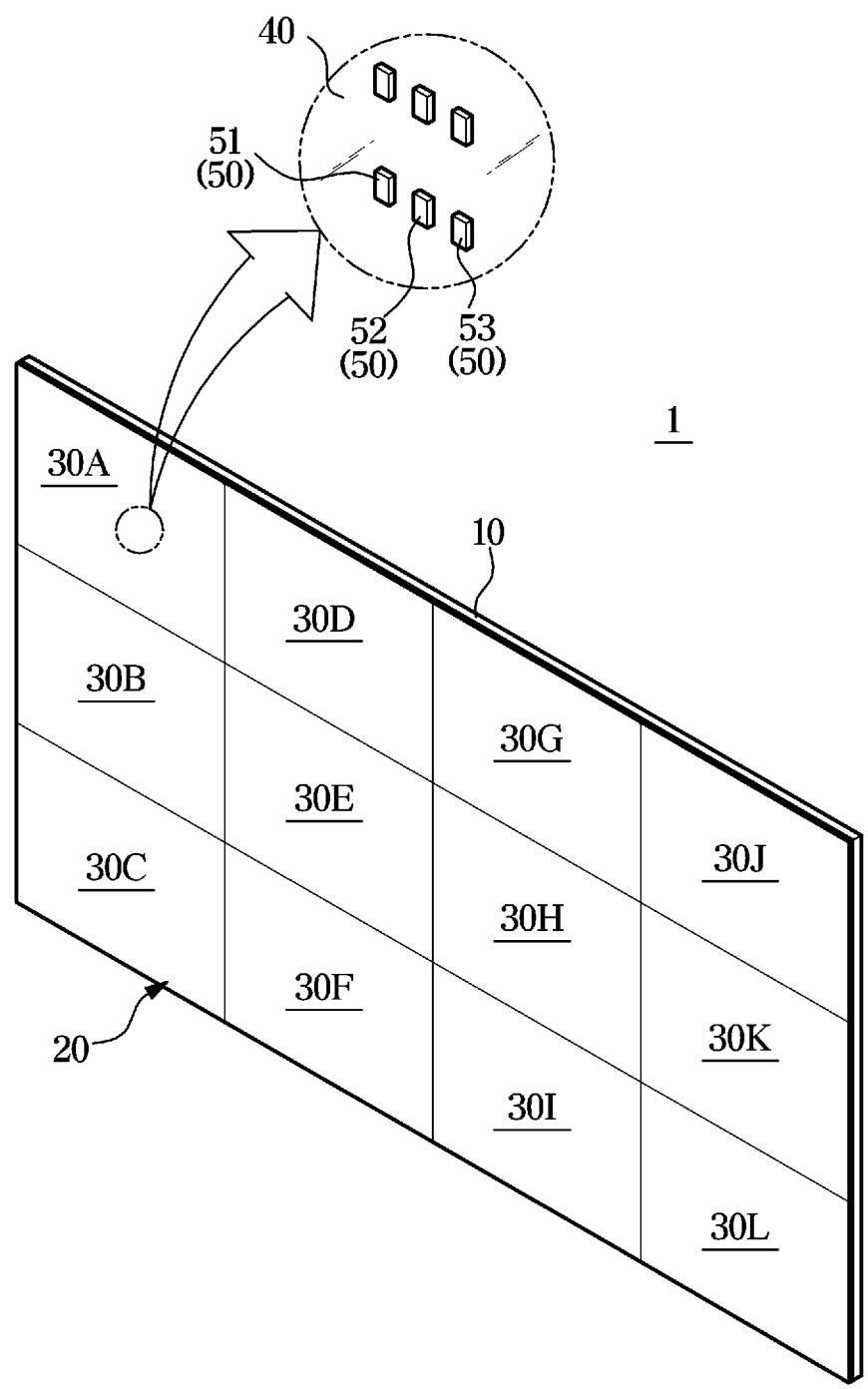
FIG. 1 shows a display device with a light absorbing layer, a light absorbing pattern, and an encapsulation layer omitted, according to an embodiment of the disclosure.

Embodiments of the present disclosure are provided to assist in a comprehensive understanding of the disclosure as defined by the claims and their equivalents. Accordingly, those of ordinary skill in the art will recognize that various changes and modifications of the embodiments described herein can be made without departing from the scope and spirit of the disclosure.

As used herein, the singular forms "a", "an" and "the" are intended to include the plural forms as well, unless the context clearly indicates otherwise. For the sake of clarity, the elements of the drawings are drawn with exaggerated forms and sizes.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Reference will now be made in detail to embodiments of the disclosure, examples of which are illustrated in the accompanying drawings, wherein like reference numerals refer to the like elements throughout.

Figure 2:
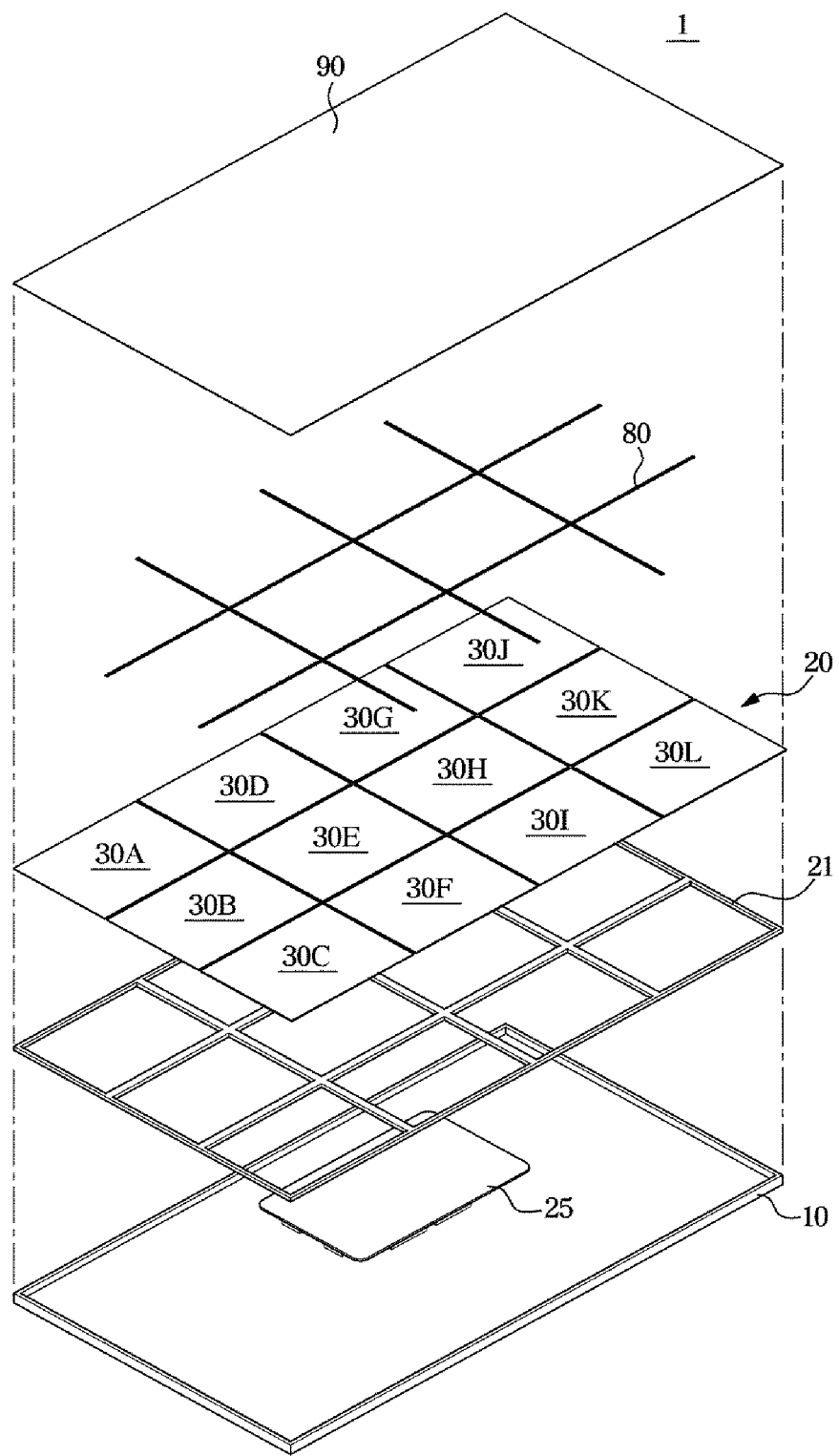
FIG. 2 is an exploded view of a major structure of the display device shown in FIG. 1.
Figure 3:
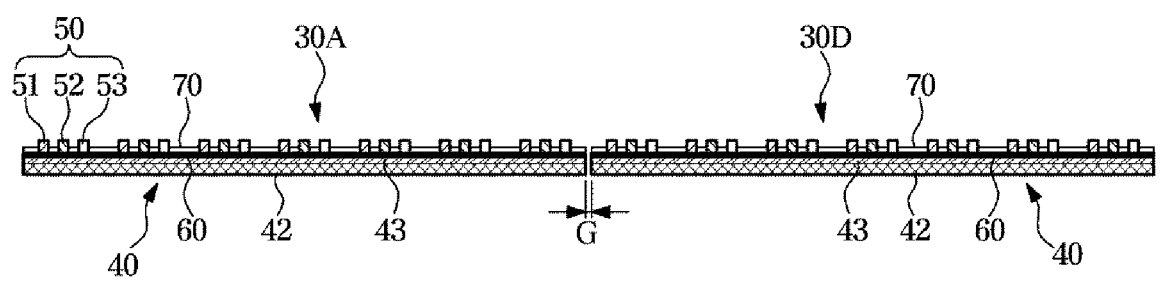
FIG. 3 is a cross-sectional view of a plurality of display modules of the display device of FIG. 1.
Figure 4:
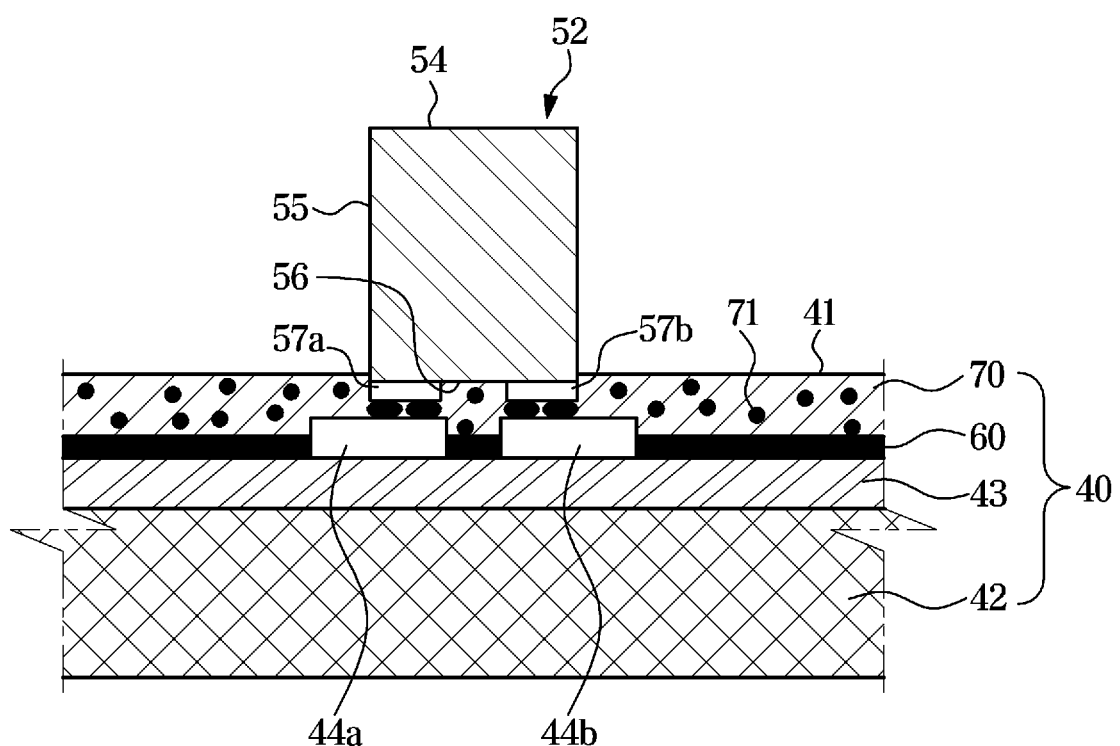
FIG. 4 shows an inorganic light emitting element mounting structure, according to an embodiment of the disclosure.
Figure 5:
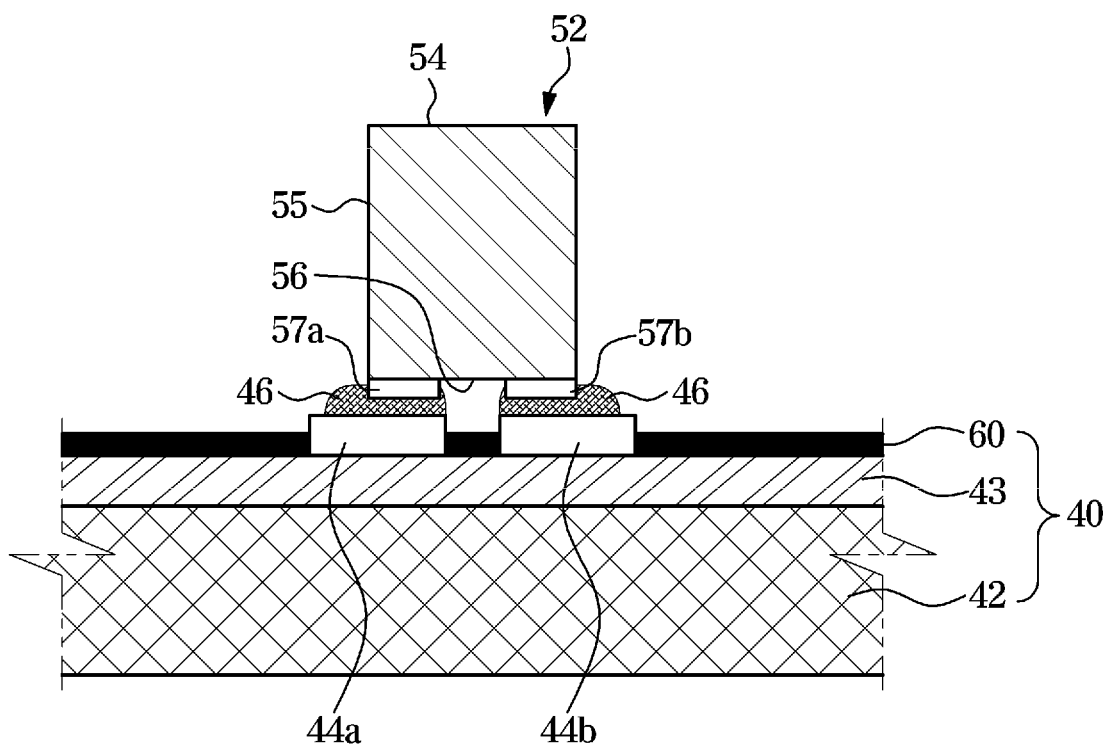
FIG. 5 shows an inorganic light emitting element mounting structure, according to another embodiment of the disclosure.
Figure 6:
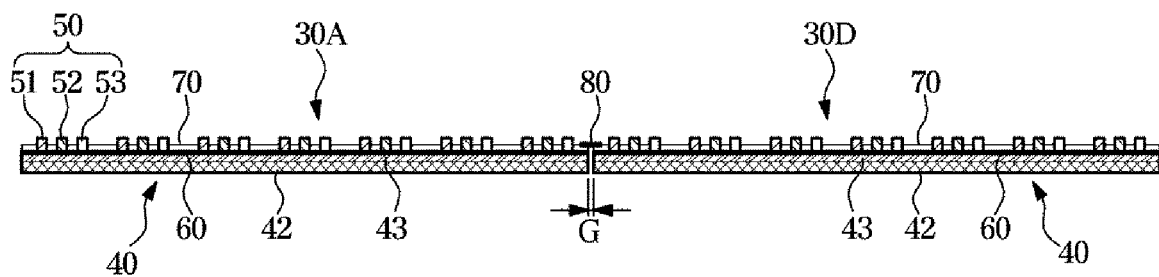
FIG. 6 is a cross-sectional view of a structure with a light absorbing pattern formed between the plurality of display modules of the display device of FIG. 1.
Figure 7:
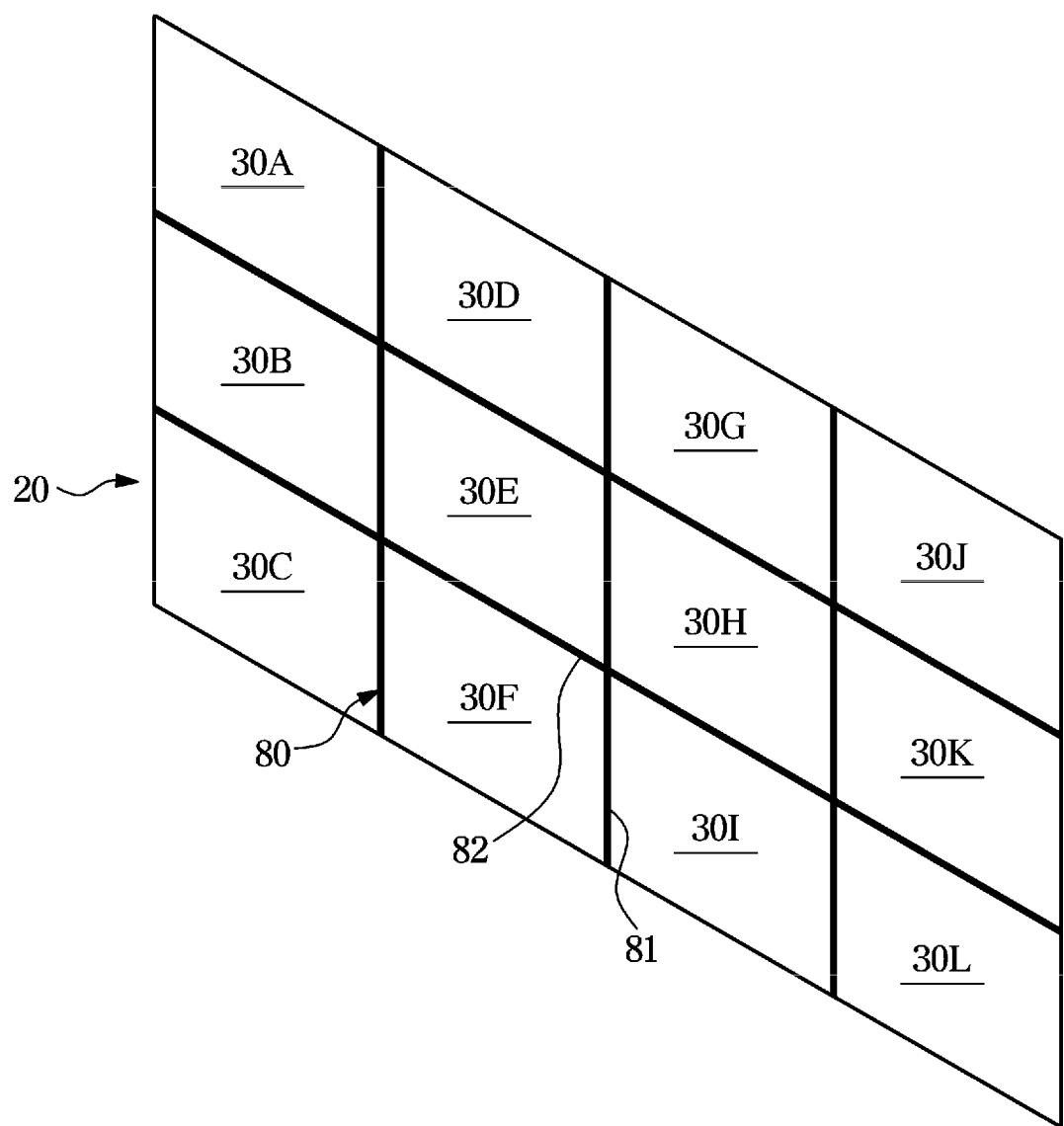
FIG. 7 is a perspective view of structure with a light absorbing pattern formed between the plurality of display modules of the display device of FIG. 1.
Figure 8:
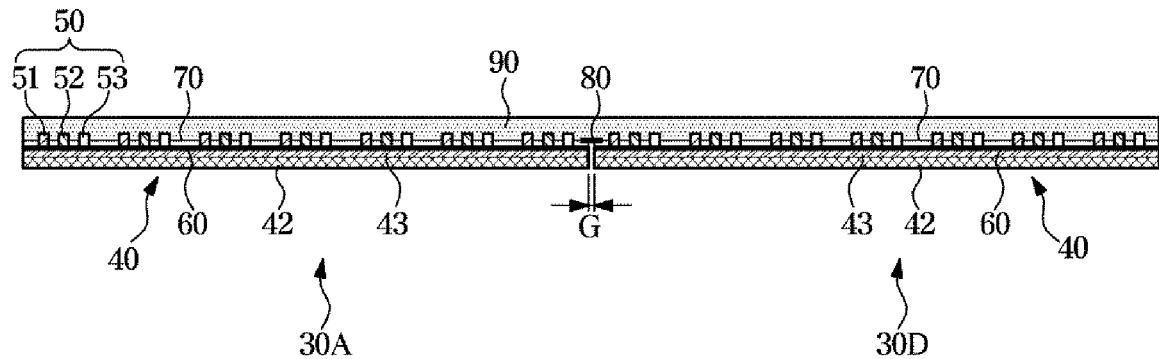
FIG. 8 is a cross-sectional view of a structure with an encapsulation layer (molding resin) formed on the plurality of display modules of the display device of FIG. 1.

FIG. 1 shows a display device with a light absorbing layer, a light absorbing pattern, and an encapsulation layer omitted, according to an embodiment of the disclosure. FIG. 2 is an exploded view of a major structure of the display device shown in FIG. 1. FIG. 3 is a cross-sectional view of a plurality of display modules of the display device of FIG. 1. FIG. 4 shows an inorganic light emitting element mounting structure, according to an embodiment of the disclosure. FIG. 5 shows an inorganic light emitting element mounting structure, according to another embodiment of the disclosure. FIG. 6 is a cross-sectional view of a structure with a light absorbing pattern formed between the plurality of display modules of the display device of FIG. 1. FIG. 7 is a perspective view of structure with a light absorbing pattern formed between the plurality of display modules of the display device of FIG. 1. FIG. 8 is a cross-sectional view of a structure with an encapsulation layer (molding resin) formed on the plurality of display modules of the display device of FIG. 1.

A display device 1 may be a device for displaying information, materials, data, etc., in characters, figures, graphs, images, etc., and may be implemented as a television, a personal computer, a mobile device, a digital signage, etc.

In an embodiment of the disclosure, the display device 1 may include a display panel 20 for displaying an image, a frame 21 for supporting the display panel 20, and a rear cover 10 for covering the back of the frame 21 as shown in FIG. 2.

The display panel 20 may include a plurality of display modules 30A to 30L, a light absorbing pattern 80 formed between the plurality of display modules 30A to 30L, and an encapsulation layer 90 formed on the plurality of display modules 30A to 30L to cover a plurality of light emitting elements 50 and mounting surfaces of the display modules 30A-30L.

The rear cover 10 may support the display panel 20. The rear cover 10 may be installed on a floor via a stand (not shown), or on a wall via a hanger (not shown). The display device 1 may include a power supplier (not shown) for supplying power to the plurality of display modules 30A to 30L, and a control board 25 for controlling operations of the plurality of display modules 30A to 30L.

The plurality of display modules 30A to 30L may be arranged vertically and horizontally to be adjacent to one another. The plurality of display modules 30A to 30L may be arranged in the form of an M×N matrix. In the embodiment of the disclosure, there are 12 display modules 30A to 30L arranged in a 4×3 matrix, but the number and the arrangement scheme of the display modules 30A to 30L are not limited thereto.

The plurality of display modules 30A to 30L may be installed within the frame 21. The plurality of display modules 30A-30L may be installed within the frame 21 in various methods known to the public, such as using magnetic force from a magnet, a mechanical fitting structure, or the like. The rear cover 10 may be coupled to the back of the frame 21, and may thus form a rear exterior of the display device 1.

The display device 1 may implement a large screen by tiling the plurality of display modules 30A to 30L.

The plurality of display modules 30A to 30L may each have the same structure. Hence, a description of a display module may be equally applied to any of the other display modules.

For example, the display module 30A may include a substrate 40, and the plurality of light emitting elements 50 mounted on the substrate 40. The substrate 40 may include a base substrate 42 and a thin film transistor (TFT) layer 43 formed on the base substrate 42 to drive the inorganic light emitting elements 50. The base substrate 42 may include a glass substrate. For example, the substrate 40 may include a chip on glass (COG) type of substrate. First and second pad electrodes 44a and 44b to electrically connect the inorganic light emitting elements 50 may be formed on the substrate 40.

The plurality of inorganic light emitting elements 50 may be formed with an inorganic material, and may include inorganic light emitting elements each having a size of a few to hundreds of micrometers (μm) in each of width, length, and height. A shortest one of the width, length, and height of the micro inorganic light emitting element may have a size of 100 μm or less. The plurality of inorganic light emitting elements 50 may be picked up from a silicon waver and transferred directly onto the substrate 40. The plurality of inorganic light emitting elements 50 may be picked up and transferred in an electrostatic method using an electrostatic head or a bonding method using an elastic high molecular substance such as PDMS, silicon, or the like as a head.

The plurality of inorganic light emitting elements 50 may be a light emitting structure including n-type semiconductors, active layers, p-type semiconductors, first contact electrodes 57a, and second contact electrodes 57b, and may have the form of a flip chip in which the first and second contact electrodes 57a and 57b are arranged toward the same direction (an opposite direction of a light emitting direction).

The inorganic light emitting element 50 may have a light emitting surface 54, side surfaces 55, and a bottom surface 56, and the first and second contact electrodes 57a and 57b may be formed on the bottom surface 56.

The first and second contact electrodes 57a and 57b may be electrically coupled to the first and second pad electrodes 44a and 44b and formed on the mounting surface 41 of the substrate 40, respectively.

The substrate 40 may include an anisotropic conductive layer 70 formed to mediate electric connection between the contact electrodes 57a and 57b and pad electrodes 44a and 44b. The anisotropic conductive layer 70 may have an anisotropic conductive adhesive adhered onto a protective film, and have a structure in which conductive balls 71 are distributed in an adhesive resin. The conductive balls 71 each have a conductive spherical body covered with a thin insulating film, and may be able to electrically bond both conductors together when the insulating film is broken by pressure.

The anisotropic conductive layer 70 may include an anisotropic conductive film (ACF) in a film form, and an anisotropic conductive paste (ACP) in a paste form.

Accordingly, when the anisotropic conductive layer 70 is pressurized while the plurality of inorganic light emitting elements 50 are mounted on the substrate 40, the insulating film of the conductive ball is broken, allowing electrical bonding of the contact electrodes 57a and 57b of the inorganic light emitting element 50 and the pad electrodes 44a and 44b of the inorganic light emitting element 50.

Alternatively, the plurality of inorganic light emitting elements 50 may be mounted on the substrate 40 through solder instead of the anisotropic conductive layer 70 (see, FIG. 5). After the inorganic light emitting elements 50 are arranged on the substrate 40, they may be bonded onto the substrate 40 by a reflow process.

The plurality of inorganic light emitting elements 50 may include red light emitting elements 51, green light emitting elements 52, and blue light emitting elements 53, and may be mounted on the mounting surface 41 of the substrate 40 in sets of a red light emitting element 51, a green light emitting element 52, and a blue light emitting element 53. The set of a red light emitting element 51, a green light emitting element 52, and a blue light emitting element 53 may form a pixel. The red light emitting element 51, the green light emitting element 52, and the blue light emitting element 53 may each form a sub pixel.

The red light emitting element 51, the green light emitting element 52, and the blue light emitting element 53 may be arranged in a row at certain intervals or in any other form such as a triangular form.

The substrate 40 may include a light absorbing layer 60 to enhance contrast by absorbing external light. The light absorbing layer 60 may be formed on the entire mounting surface of the substrate 40 with the same material as that of a light absorbing pattern 80, which will be described later. The light absorbing layer 60 may be formed between the TFT layer 43 and the anisotropic conductive layer 70.

Referring to FIGS. 1 and 3, in the display device 1, gap G may be formed between the plurality of display modules 30A to 30L when the plurality of display modules 30A to 30L are tiled. Scattered reflection of light occurs in the gap G, creating a sense of otherness and degrading image quality.

Hence, according to an embodiment of the disclosure, the display panel 20 may include the light absorbing pattern 80 formed between the plurality of display modules 30A to 30L to prevent creation of the sense of otherness and degradation of image quality due to seams exposed by the gap G between the plurality of display modules 30A to 30L.

As described above, because the display modules 30A to 30L are arranged vertically and horizontally in the form of an M×N matrix, the light absorbing pattern 80 may be formed in a cross striped or mesh pattern including a horizontal pattern 81 and a vertical pattern 82 (see, FIG. 7). The light absorbing pattern 80 may physically fill the gap G between the plurality of display modules 30A to 30L.

For example, the light absorbing pattern 80 may be formed to cover the gap G between the neighboring plurality of display modules 30A to 30L. The light absorbing pattern 80 may be formed on the substrate 40 of the display module 30A and on the substrate 40 of the display module 30D. Specifically, the light absorbing pattern 80 may be formed on the anisotropic conductive layer 70 of the display module 30A and on the anisotropic conductive layer 70 of the display module 30D.

The light absorbing pattern 80 may be formed on the anisotropic conductive layers 70 of the plurality of display modules 30, and as a result, between the anisotropic conductive layer 70 and the encapsulation layer 90.

Alternatively, the light absorbing pattern 80 may be formed to fill in the gap G between the neighboring display modules 30A and 30D. Some of the light absorbing pattern 80 may be formed on the substrates 40 to cover the gap G, and some of the light absorbing pattern 80 may be formed in the gap G to fill the gap G.

The light absorbing pattern 80 may include a black inorganic material, a black organic material, a black metal, etc., which absorbs light well, to maximize the light absorption effect.

For example, the light absorbing pattern 80 may be formed with such a material as a carbon black, polyene pigment, azo pigment, azomethine pigment, diimmonium pigment, phthalocyanine pigment, quinone pigment, indigo pigment, thioindigo pigment, dioxadin pigment, quinacridone pigment, isoindolinone pigment, metal oxide, metal complex, aromatic hydrocarbon, etc.

The light absorbing pattern 80 may be formed by applying light absorbing ink between the plurality of display modules 30A to 30L and hardening the ink. Alternatively, it may be formed by coating a light absorbing film between the plurality of display modules 30A to 30L.

In an embodiment of the disclosure, after the light absorbing pattern 80 is formed between the plurality of display modules 30A to 30L, the encapsulation layer 90 may be formed on the plurality of display modules 30A to 30L to cover the plurality of inorganic light emitting elements 50 and the mounting surfaces 41 of the substrate.

According to the conventional technology to implement a large screen by tiling, a display panel is made by forming an encapsulation layer for each display module to protect a plurality of inorganic light emitting elements thereon, and then the plurality of display panels are tiled to implement the large screen. In this case, a gap is formed even between the neighboring encapsulation layers, and to recognize seams from the gap between the encapsulation layers and solve creation of a sense of otherness and degradation of image quality due to the gap, a flank light absorbing layer is sometimes formed on the flank of the encapsulation layer. However, this process is very challenging and complicated.

To solve this problem, in accordance with an embodiment of the disclosure, the plurality of display modules 30A to 30L are adjacently arranged first, and then the encapsulation layer 90 is collectively formed on the entire area of the mounting surfaces 41 of the display modules 30A to 30L. The encapsulation layer 90 may be formed to cover the light absorbing pattern 80.

Accordingly, no gap is formed in the area of the encapsulation layer 90 because the encapsulation layer 90 is formed in a lump on the whole display modules 30A to 30L. Hence, the seamless effect may be obtained more easily and efficiently in implementing a large screen by tiling.

Furthermore, encapsulating the plurality of display modules 30A to 30L entirely may also have an effect of putting the plurality of display modules 30A to 30L together.

The encapsulation layer 90 may be formed by applying a transparent molding resin on the plurality of display modules 30A to 30L and hardening the molding resin. The molding resin may include a translucent or fluorescent material that is in a liquid state at room temperature, such as an acrylic acid resin, a polyimide resin, an epoxy resin, a polyurethane resin. The molding resin may be solidified by hardening, thereby physically protecting the inorganic light emitting elements 50.

Figure 9:
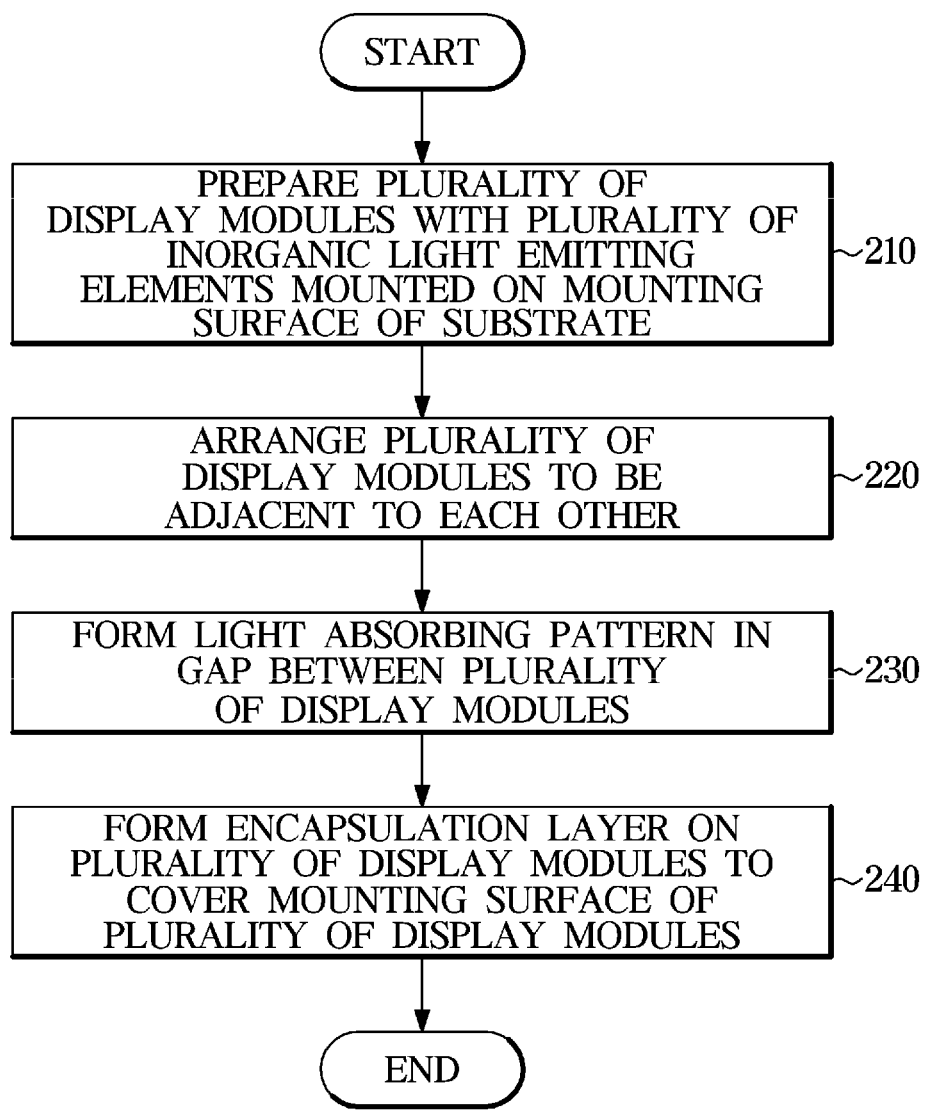
FIG. 9 is a flowchart illustrating a method for manufacturing a display device, according to an embodiment of the disclosure.

FIG. 9 is a flowchart illustrating a method for manufacturing a display device, according to an embodiment of the disclosure.

Referring to FIGS. 1 to 9, a method for manufacturing a display device according to an embodiment of the disclosure will be briefly described.

First, the plurality of display modules 30A to 30L are prepared, in 210. Each of the plurality of display modules 30A to 30L may be formed by having the plurality of inorganic light emitting elements 50 mounted on the mounting surface 41 of the substrate 40. To have enhanced contrast, the substrate 40 may include the light absorbing layer 60. The substrate 40 may include the anisotropic conductive layer 70 to easily bond the plurality of inorganic light emitting elements 50 onto the substrate 40.

Next, the plurality of display modules 30A to 30L may be arranged to be adjacent to one another, in 220. The plurality of display modules 30A to 30L may be fixed by a jig. The plurality of display modules 30A to 30L may be arranged in the form of an M×N matrix.

Next, the light absorbing pattern 80 may be formed between the plurality of display modules 30A to 30L, in 230. The light absorbing pattern 80 may prevent scattered reflection and leakage of light and attain the seamless effect by filling the gap G between the plurality of display modules 30A to 30L.

Subsequently, the encapsulation layer 90 may be formed on the plurality of display modules 30A to 30L to cover and protect the plurality of inorganic light emitting elements 50, in 240. In forming the encapsulation layer 90, the plurality of display modules 30A to 30L are encapsulated not separately but entirely, thereby preventing the gap from being formed in the area of the encapsulation layer 90. The display panel 20 formed in this way is installed within the frame 21.

Figure 10:
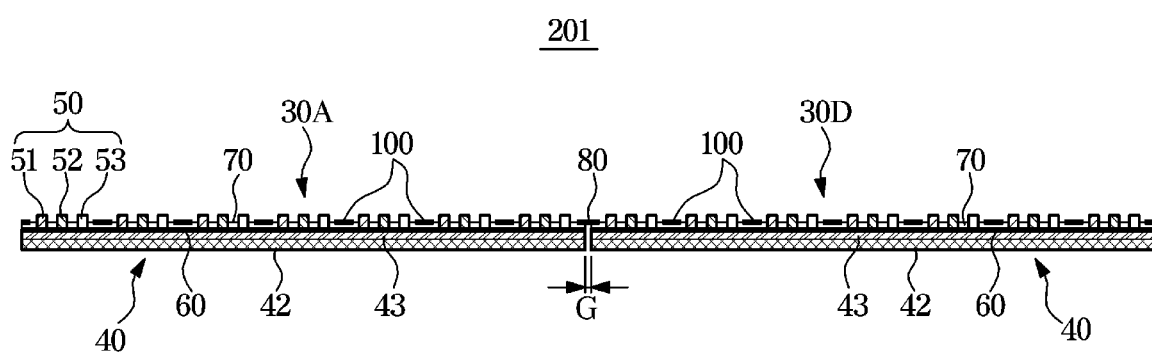
FIG. 10 is a cross-sectional view of a structure with a light absorbing pattern and an auxiliary light absorbing pattern formed between a plurality of display modules and between a plurality of inorganic light emitting elements of a display device, according to another embodiment of the disclosure.
Figure 11:
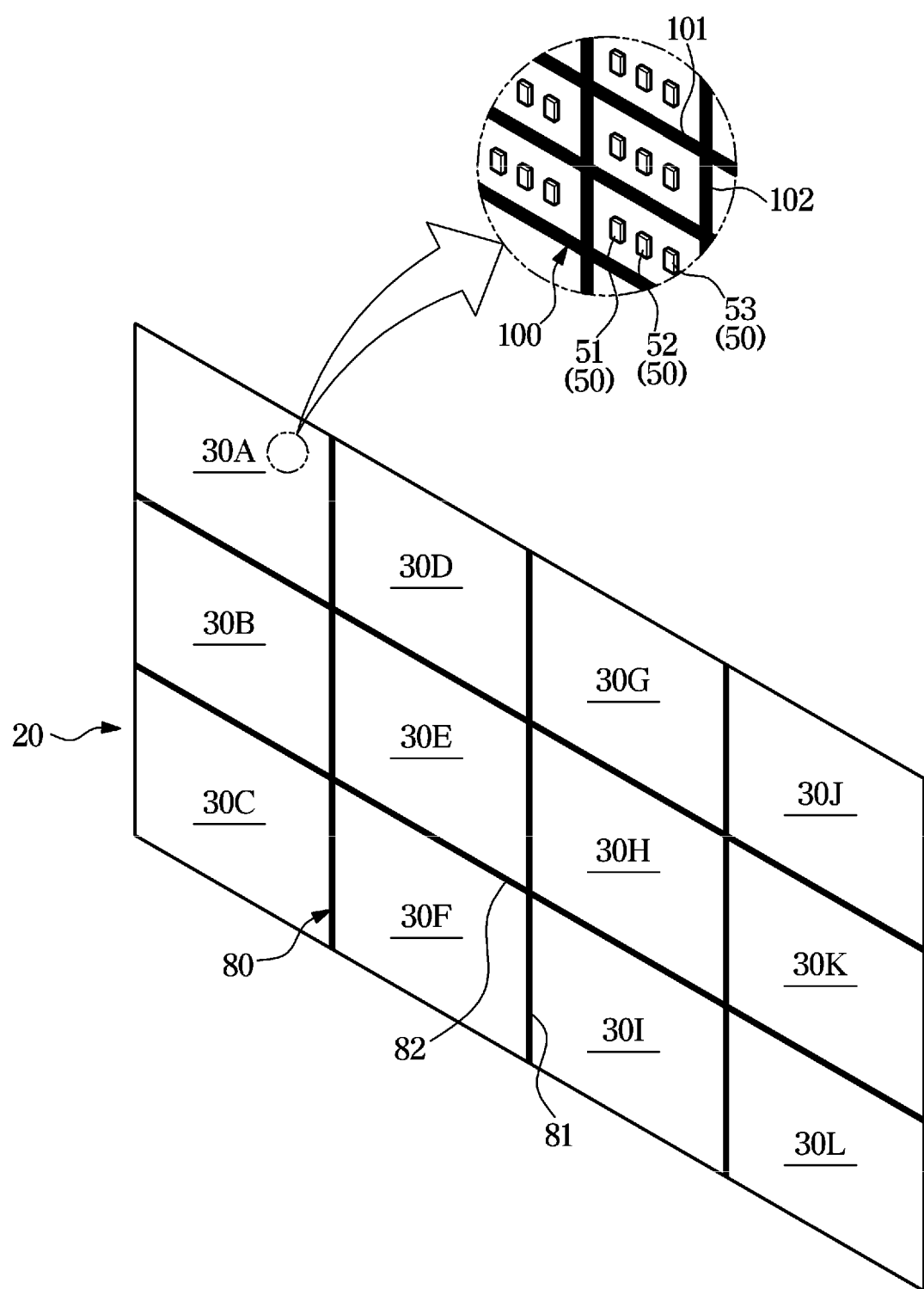
FIG. 11 is a perspective view of a structure with the light absorbing pattern and an auxiliary light absorbing pattern formed between a plurality of display modules and between a plurality of inorganic light emitting elements of the display device of FIG. 10.
Figure 12:
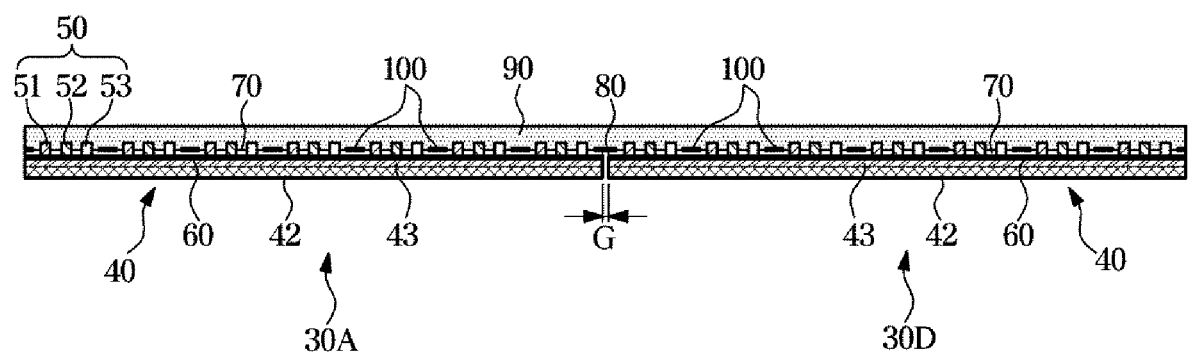
FIG. 12 is a cross-sectional view of a structure with an encapsulation layer (molding resin) formed on the plurality of display modules of the display device of FIG. 10.

FIG. 10 is a cross-sectional view of a structure with a light absorbing pattern and an auxiliary light absorbing pattern formed between a plurality of display modules and between a plurality of inorganic light emitting elements of a display device, according to another embodiment of the disclosure. FIG. 11 is a perspective view of a structure with the light absorbing pattern and an auxiliary light absorbing pattern formed between a plurality of display modules and between a plurality of inorganic light emitting elements of the display device of FIG. 10. FIG. 12 is a cross-sectional view of a structure with an encapsulation layer (molding resin) formed on the plurality of display modules of the display device of FIG. 10.

Referring to FIGS. 10 to 12, a display device 201 according to another embodiment of the disclosure will be described. The same features as in the aforementioned embodiment are denoted by the same reference numerals, and the overlapping description will not be repeated.

Unlike the previous embodiment, a display panel 20 may further include an auxiliary light absorbing pattern 100 formed between the plurality of inorganic light emitting elements 50 in addition to the light absorbing pattern 80 formed between the plurality of display modules 30A to 30L.

The auxiliary light absorbing pattern 100 may serve to complement the light absorbing layer 60 formed entirely on the mounting surface 41 of the substrate 40. For example, the auxiliary light absorbing pattern 100 may absorb external light, making the substrate 40 look black and thus enhancing contrast of the screen.

Similar to the light absorbing layer 60 and the light absorbing pattern 80, the auxiliary light absorbing pattern 100 may have black color.

In this embodiment, the auxiliary light absorbing pattern 100 may be formed to be arranged between pixels, each pixel including a set of a red light emitting element 51, a green light emitting element 52, and a blue light emitting element 53. Alternatively, the auxiliary light absorbing pattern 100 may be more finely formed to separate each sub pixel, i.e., each of the light emitting elements 51, 52, and 53.

The auxiliary light absorbing pattern 100 may be formed as a cross-striped pattern including a horizontal pattern 101 and a vertical pattern 102 arranged among the pixels. The auxiliary light absorbing pattern 100 may be formed in a method similar to that of the light absorbing pattern 80. For example, the auxiliary light absorbing pattern 100 may be formed by applying and then hardening a light absorbing ink or by coating a light absorbing film.

In this way, as the auxiliary light absorbing pattern 100 may be formed with the same material and in the same method as for the light absorbing pattern 80, the auxiliary light absorbing pattern 100 may be formed with the light absorbing pattern 80 at the same time in a single process. Hence, the manufacturing process of the display device may become simplified and easier.

Figure 13:
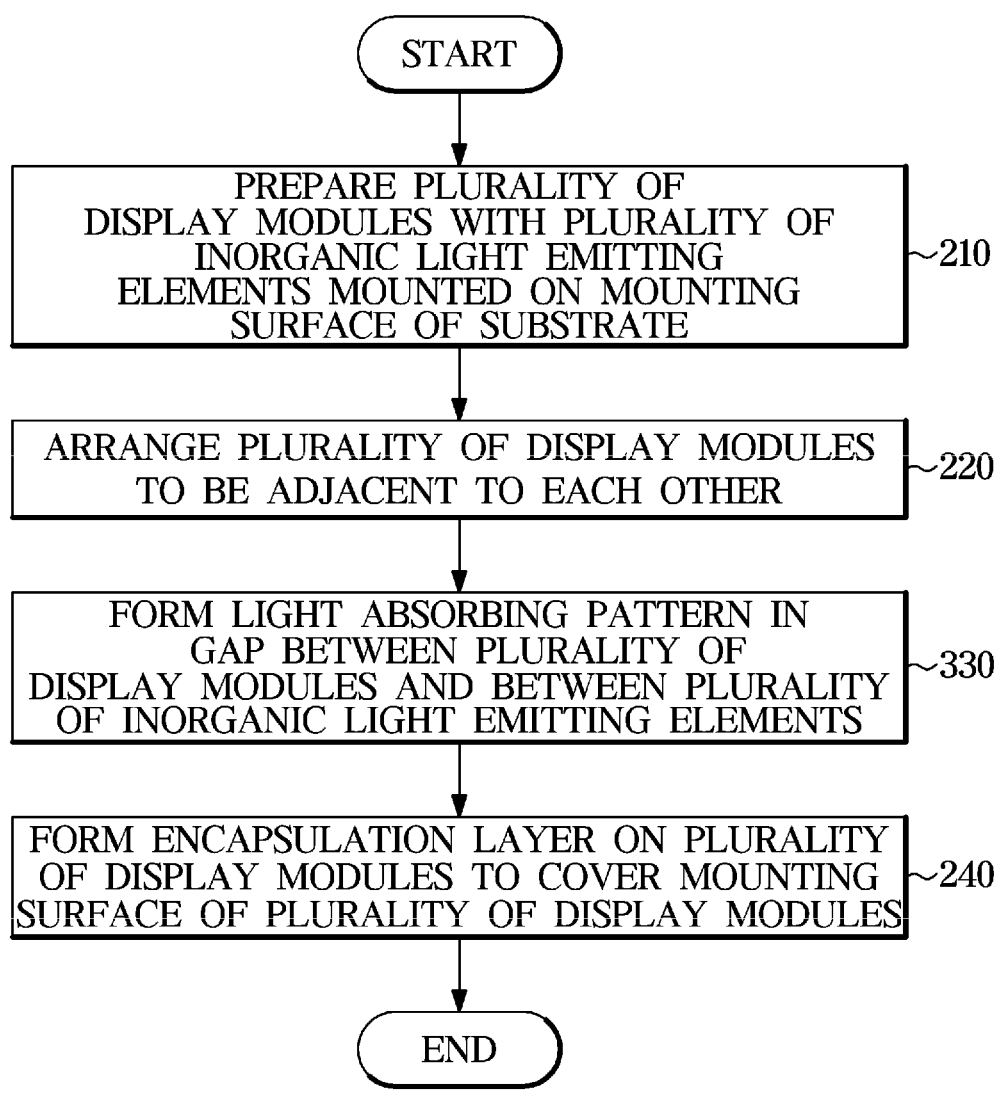
FIG. 13 is a flowchart illustrating a method for manufacturing a display device, according to another embodiment of the disclosure.

FIG. 13 is a flowchart illustrating a method for manufacturing a display device, according to another embodiment of the disclosure.

Referring to FIGS. 10 to 13, a method for manufacturing a display device according to another embodiment of the disclosure will be briefly described.

First, the plurality of display modules 30A to 30L are prepared, in 210. Each of the plurality of display modules 30A to 30L may be formed by having a plurality of inorganic light emitting elements mounted on the substrate 40. To have enhanced contrast, the substrate 40 may include the light absorbing layer 60. The substrate 40 may include the anisotropic conductive layer 70 to easily bond the plurality of inorganic light emitting elements 50 onto the substrate 40.

Next, the plurality of display modules 30A to 30L may be arranged to be adjacent to one another, in 220. The plurality of display modules 30A to 30L may be fixed by a jig. The plurality of display modules 30A to 30L may be arranged in the form of an M×N matrix.

Next, the light absorbing pattern 80 may be formed between the plurality of display modules 30A to 30L, in 330. The light absorbing pattern 80 may prevent scattered reflection and leakage of light and attain the seamless effect by filling the gap G between the plurality of display modules 30A to 30L.

In this regard, the auxiliary light absorbing pattern 100 may be formed between the plurality of inorganic light emitting elements 50. The auxiliary light absorbing pattern 100 may absorb external light, enabling the display device 201 to create clearer images. The auxiliary light absorbing pattern 100 may be formed with the same material and in the same method as for the light absorbing pattern 80. Accordingly, the light absorbing pattern 80 and the auxiliary light absorbing pattern 100 may be simultaneously formed in a single process.

Subsequently, the encapsulation layer 90 may be formed on the plurality of display modules 30A to 30L to cover and protect the plurality of inorganic light emitting elements 50, in 240. In forming the encapsulation layer 90, the plurality of display modules 30A to 30L are encapsulated not separately but entirely, thereby preventing the gap from being formed in the area of the encapsulation layer 90. The display panel 20 formed in this way is installed within the frame 21.

Figure 14:
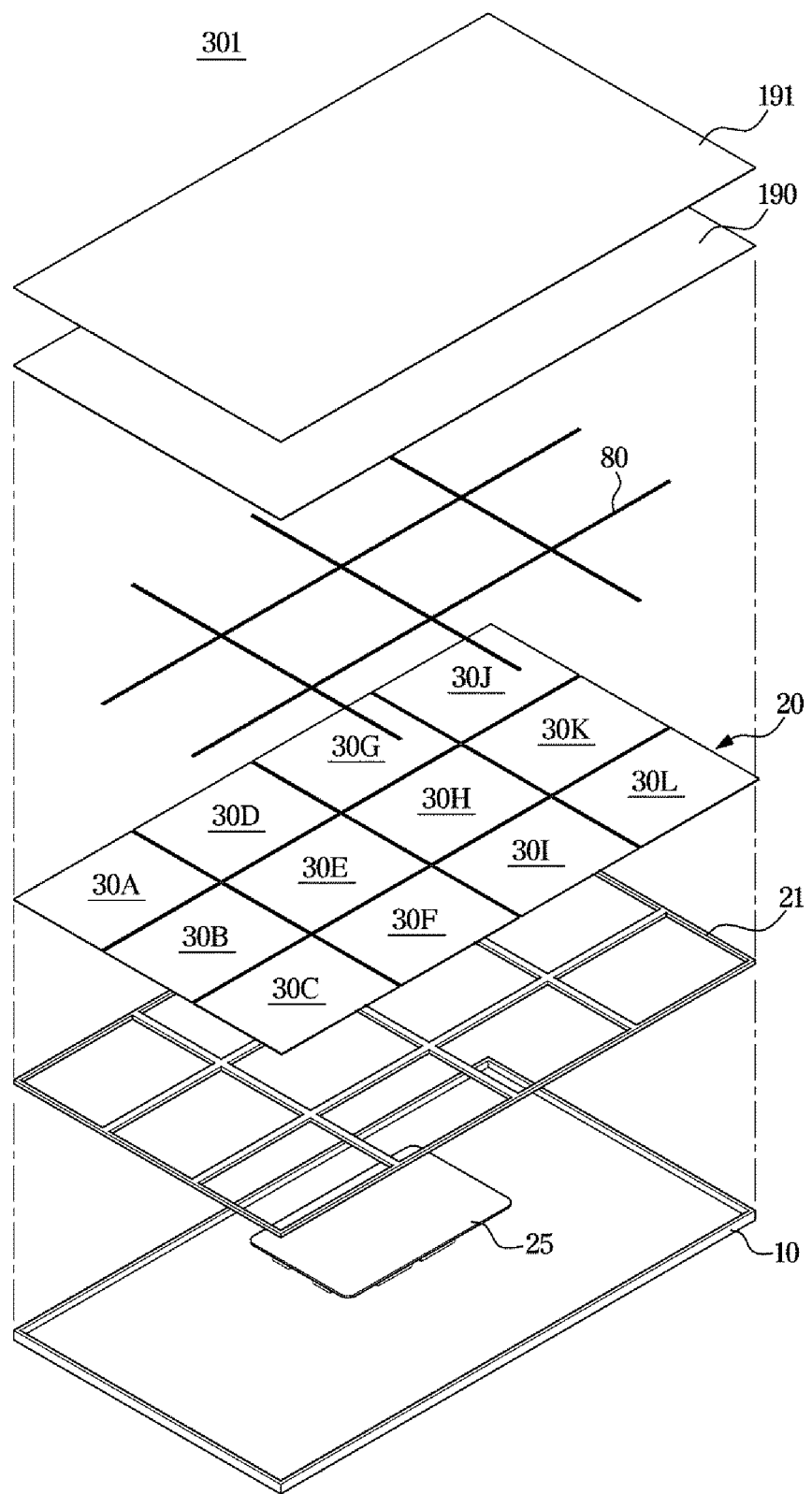
FIG. 14 is an exploded view of a major structure of a display device, according to another embodiment of the present disclosure.
Figure 15:
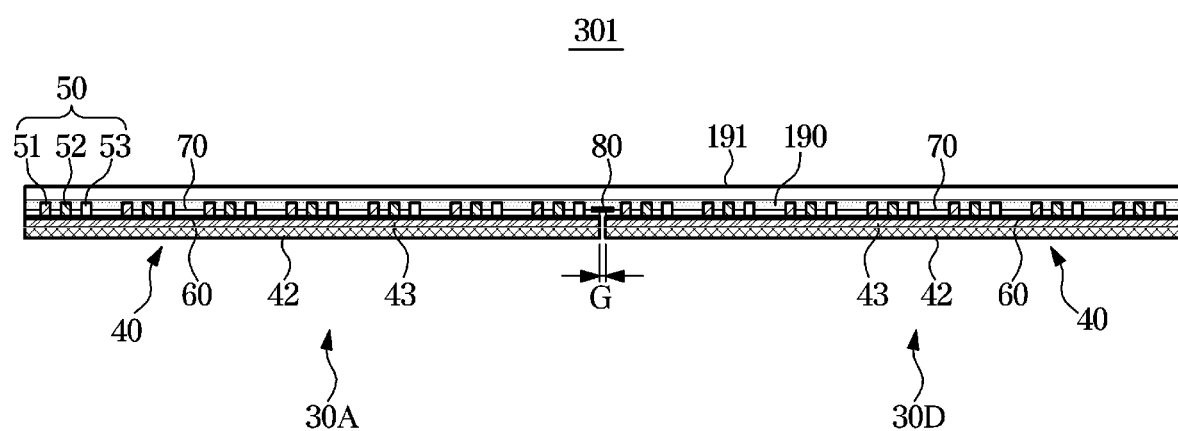
FIG. 15 is a cross-sectional view of a structure with an encapsulation layer (optical adhesive) formed on mounting surfaces of the plurality of display modules of the display device of FIG. 14.
Figure 16:
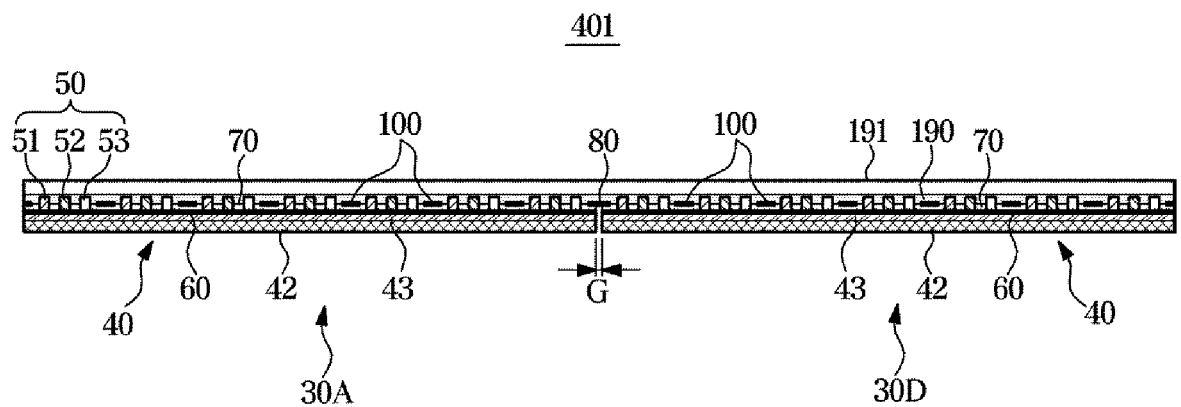
FIG. 16 is a cross-sectional view of a structure with an encapsulation layer (optical adhesive) and a cover glass attached onto mounting surfaces of a plurality of display modules of a display device, according to an embodiment of the disclosure.

FIG. 14 is an exploded view of a major structure of a display device, according to another embodiment of the present disclosure. FIG. 15 is a cross-sectional view of a structure with an encapsulation layer (optical adhesive) formed on mounting surfaces of the plurality of display modules of the display device of FIG. 14. FIG. 16 is a cross-sectional view of a structure with an encapsulation layer (optical adhesive) and a cover glass attached onto mounting surfaces of a plurality of display modules of a display device, according to an embodiment of the disclosure.

Referring to FIGS. 14 to 16, a display device 301, 401 according to another embodiment of the disclosure will be described.

Unlike the previous embodiment of the disclosure, instead of the molding resin, an optical adhesive 190 may be used for the encapsulation layer.

For the optical adhesive 190, an optical cleared adhesive (OCA) or optical clear resin (OCR) may be used. The OCA and the OCR may be in a very clear state when the transmittance of them is greater than about 90%.

Both the OCA and the OCR may increase their transmittance by low reflectivity characteristics, thereby increasing visibility and image quality. While a structure having the air gap has light loss due to the difference in refractive index between a film layer and an air layer, the structure using the OCA or OCR may less light loss because the difference in refractive index between a film layer and a optical adhesive layer is reduced, thereby increasing visibility and image quality.

In other words, the OCA and the OCR may simply bond the neighboring component layers and also have benefits in terms of improved image quality.

A difference lies in that the OCA and the OCR are applied in the process in the form of a film and in a liquid form, respectively.

When the optical adhesive 190 is used for the encapsulation layer, a cover glass 191 may be attached onto the optical adhesive 190 to physically protect the plurality of inorganic light emitting elements 50.

Even when the optical adhesive 190 is used for the encapsulation layer, the light absorbing pattern 80 may be formed between the plurality of display modules 30A to 30L, as shown in FIGS. 14 and 15. Furthermore, the light absorbing pattern 80 may be formed between the plurality of display modules 30A to 30L, and the auxiliary light absorbing pattern 100 may be formed between the plurality of inorganic light emitting elements 50, as shown in FIG. 16.

According to embodiments of the disclosure, a display device may have a seamless effect that makes a seam between neighboring display modules invisible because the light entering into the gap is absorbed by a light absorbing pattern.

According to embodiments of the disclosure, a display device may have an encapsulation layer collectively formed after a plurality of display modules assembled, thereby attaining the seamless effect more easily and efficiently.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:
1. A display device comprising:
 a plurality of display modules including a plurality of substrates, wherein the plurality of substrates are spaced apart from each other and each of the plurality of display modules includes a substrate of the plurality of substrates and a plurality of inorganic light emitting elements mounted on a mounting surface of the substrate;

a light absorbing pattern formed to cover a gap between the plurality of display modules; and an encapsulation layer formed on mounting surfaces of the plurality of display modules to cover the mounting surfaces of the plurality of display modules.

2. The display device of claim 1, wherein the light absorbing pattern has a cross-striped form.

3. The display device of claim 1, wherein the substrate comprises an anisotropic conductive layer for electrically connecting contact electrodes of the plurality of inorganic light emitting elements to pad electrodes of the substrate.

4. The display device of claim 3, wherein the light absorbing pattern is formed on the anisotropic conductive layer.

5. The display device of claim 1, wherein the encapsulation layer is formed to cover the light absorbing pattern.

6. The display device of claim 1, wherein the substrate comprises a glass substrate and a thin film transistor (TFT) layer formed on the glass substrate.

7. The display device of claim 1, wherein the encapsulation layer comprises a transparent molding resin made with at least one of acrylic resin, polyimide resin, epoxy resin, polyurethane resin, or silicon resin.

8. The display device of claim 1, wherein the encapsulation layer comprises an optical adhesive made with one of an optical cleared adhesive (OCA) and an optical clear resin (OCR).

9. The display device of claim 8, further comprising: a cover glass attached onto the optical adhesive.

10. The display device of claim 1, further comprising: an auxiliary light absorbing pattern formed between the plurality of inorganic light emitting elements.

11. The display device of claim 1, further comprising: a rear cover for supporting the plurality of display modules.

12. The display device of claim 1, wherein the substrate comprises a light absorbing layer formed entirely on the mounting surface to enhance contrast by absorbing external light.

13. A method for manufacturing a display device, the method comprising:

preparing a plurality of display modules including a plurality of substrates, wherein each of the plurality of display modules is formed with a substrate of the plurality of substrates and a plurality of inorganic light emitting elements mounted on a mounting surface of the substrate;

arranging the plurality of display modules to be adjacent to each other such that the plurality of substrates are spaced apart from each other;

forming a light absorbing pattern to cover a gap formed between the plurality of display modules; and forming an encapsulation layer on mounting surfaces of the plurality of display modules to cover the mounting surfaces of the plurality of display modules.

14. The method of claim 13, wherein the plurality of inorganic light emitting elements mounted on the mounting surface of a substrate is obtained by picking up the plurality of inorganic light emitting elements from a wafer and transferring the plurality of inorganic light emitting elements onto the substrate.

15. The method of claim 13, wherein the arranging of the plurality of display modules to be adjacent to each other comprises arranging the plurality of display modules in the form of an M×N matrix.

16. The method of claim 14, further comprising: forming an auxiliary light absorbing pattern between the plurality of inorganic light emitting elements.

17. The method of claim 16, wherein the forming of the light absorbing pattern between the plurality of display modules and the forming of the auxiliary light absorbing pattern between the plurality of inorganic light emitting elements are performed at the same time.

18. The method of claim 15, wherein the forming of an encapsulation layer comprises applying a transparent molding resin made with at least one of acrylic resin, polyimide resin, epoxy resin, polyurethane resin, or silicon resin onto the mounting surfaces of the plurality of display modules.

19. The method of claim 15, wherein the forming of an encapsulation layer comprises adhering an optical adhesive made with one of an optical cleared adhesive (OCA) and an optical clear resin (OCR) onto the mounting surfaces of the plurality of display modules.

20. The method of claim 19, further comprising: attaching a cover glass onto the optical adhesive.

* * * * *